(12) United States Patent
Garg et al.

(10) Patent No.: US 8,976,618 B1
(45) Date of Patent: Mar. 10, 2015

(54) DECODED 2N-BIT BITCELLS IN MEMORY FOR STORING DECODED BITS, AND RELATED SYSTEMS AND METHODS

(71) Applicant: QUALCOMM Incorporated, San Diego, CA (US)

(72) Inventors: Manish Garg, Cary, NC (US); Rajesh Kumar, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/161,530

(22) Filed: Jan. 22, 2014

Related U.S. Application Data

(60) Provisional application No. 61/896,166, filed on Oct. 28, 2013.

(51) Int. Cl.
*G11C 8/00* (2006.01)
*G11C 8/10* (2006.01)
*G11C 11/412* (2006.01)

(52) U.S. Cl.
CPC ............... *G11C 8/10* (2013.01); *G11C 11/412* (2013.01)
USPC ............ 365/230.06; 365/230.08; 365/230.09; 365/189.05

(58) Field of Classification Search
USPC .............. 365/230.06, 230.08, 230.09, 189.05
See application file for complete search history.

(56) References Cited

U.S. PATENT DOCUMENTS

| | | | |
|---|---|---|---|
| 7,804,711 B2 | 9/2010 | Wu | |
| 8,181,054 B2* | 5/2012 | Terechko et al. | 713/323 |
| 8,284,593 B2* | 10/2012 | Russell et al. | 365/154 |
| 8,432,745 B2 | 4/2013 | Wu | |
| 8,730,713 B2* | 5/2014 | Garg et al. | 365/154 |
| 2012/0137047 A1 | 5/2012 | Hars et al. | |
| 2012/0224421 A1 | 9/2012 | Litsyn et al. | |
| 2013/0107611 A1 | 5/2013 | Cai et al. | |
| 2013/0268737 A1* | 10/2013 | Bajkowski et al. | 711/154 |

\* cited by examiner

*Primary Examiner* — Connie Yoha
(74) *Attorney, Agent, or Firm* — Withrow & Terranova, PLLC

(57) ABSTRACT

Decoded $2^n$-bit bitcells in memory for storing decoded bits, and related systems and methods are disclosed. In one embodiment, a decoded $2^n$-bit bitcell containing $2^n$ state nodes is provided. Each state node includes storage node to store decoded bit. Storage node provides bit to read bitline, coupled to decoded word output. Each state node includes active decoded bit input coupled to storage node that receives decoded bit from decoded word to store in storage node in response to write wordline. State node comprised of $2^n-1$ passive decoded bit inputs, each coupled to one of $2^n-1$ remaining storage nodes. $2^n-1$ passive decoded bit inputs receive $2^n-1$ decoded bits not received by active decoded bit input. State node includes logic that receives $2^n-1$ decoded bits. Logic retains decoded bit, provides it to passive decoded bit output. Passive decoded word output is coupled to storage node to store decoded bit in storage node.

23 Claims, 11 Drawing Sheets

| PERFORMANCE METRIC | 6T BITCELL (36) | DECODED $2^n$-BIT BITCELL (54) |
|---|---|---|
| TIMING | | BETTER (SAVES DECODING DELAY IN READ PATH) |
| DYNAMIC POWER | | BETTER (ACTIVITY OF READ BITLINES (64) REDUCES BY 50% FOR DIFFERENTIAL DOMINO READ/DECODE IMPLEMENTATION) |
| READ STACK STORAGE | | BETTER (REDUCES BY 50%, ONLY 2 READ STACKS WILL HAVE '1' ON THE BOTTOM DEVICE) |
| NOISE | | NEEDS LESS WIRE RESOURCES TO SHIELD READ BITLINES (64) |
| WRITABILITY | | EASIER TO SIZE THE DECODED $2^n$-BIT BITCELL (54) FOR BETTER WRITE MARGIN AS STACKED PMOS IS WEAK |
| AREA | 25% SMALLER | |

*FIG. 8*

DECODED 2N-BIT BITCELLS IN MEMORY FOR STORING DECODED BITS, AND RELATED SYSTEMS AND METHODS

PRIORITY CLAIM

The present application claims priority to U.S. Provisional Patent Application Ser. No. 61/896,166 filed on Oct. 28, 2013 and entitled "DECODED 2N-BIT BITCELLS IN MEMORY FOR STORING DECODED BITS, AND RELATED SYSTEMS AND METHODS," which is incorporated herein by reference in its entirety.

BACKGROUND

I. Field of the Disclosure

The technology of the disclosure relates generally to memory bitcells, and particularly to bitcells storing decoded values.

II. Background

Processor-based computer systems include digital circuits that employ memory for data storage. Such memory often contains a plurality of bitcells, wherein each bitcell is able to store a single bit value. Memory may also contain other digital circuits that use encoded words to control access to the bitcells according to a memory address in a received memory access request. One example is use of an encoded word to provide way selection in a cache memory. An encoded word of "n" bits enables a digital circuit to store fewer bits to retain the equivalent value of a decoded word, where the decoded word has $2^n$-bits. Thus, an n-bit encoded word can be decoded into a "one-hot" decoded word of $2^n$-bits. A word is "one-hot" when only one bit within the word is at a hot logic level, while the remaining bits in the word are each at a non-hot logic level. As a non-limiting example, a 2-bit encoded word "00" may represent a one-hot, 4-bit decoded word "0001," where the value "1" represents a hot logic level.

Because an encoded word has fewer bits than its corresponding decoded word, storing an encoded word in memory is effective at minimizing the number of storage elements employed to store the word, thus also minimizing circuit area. For example, while storing an n-bit encoded word requires 'n' storage elements, storing an equivalent $2^n$-bit decoded word would require $2^n$ storage elements. Thus, the area required for storing an encoded word may be less than the area required to store a corresponding decoded word. However, once the encoded word is read from the memory, decoder logic is required to convert the encoded word into a decoded word. Thus, it is common for a digital circuit to read the encoded word from the memory, which is then decoded by a decoder function into a decoded word for use by the circuit.

As an example, FIG. 1 illustrates an exemplary cache memory 10 that stores encoded words for use in memory accesses. As illustrated in FIG. 1, the cache memory 10 includes a plurality of sets 12(0)-12(M−1), wherein 'M' is a positive whole number such that the number of the plurality of sets 12 is 'M'. Each set 12(0)-12(M−1) includes a prediction array 14(0)-14(M−1) that receives a 2-bit encoded word 16(0)-16(M−1) from an encoder 18(0)-18(M−1). Each prediction array 14(0)-14(M−1) is comprised of six transistor (6T) Static Random Access Memory (SRAM) bitcells (not shown) in this example. A decoder 20(0)-20(M−1) is also included in each set 12(0)-12(M−1), wherein the area of the decoder 20(0)-20(M−1) directly correlates to the number of storage elements within the prediction array 14(0)-14(M−1). Further, each set 12(0)-12(M−1) includes a data array 22(0)-22(M−1), wherein each data array 22(0)-22(M−1) is divided into four ways 24(0)-24(3). The way 24 information (not shown) for each set 12(0)-12(M−1) is stored as 2-bit predicted words 26(0)-26(N−1) within each prediction array 14(0)-14(M−1), (wherein 'N' is a positive whole number such that the number of the plurality of predicted words 26 is 'N').

With continuing reference to FIG. 1, using components relating only to set 12(0) of the cache memory 10 as an example, a 4-bit word 28(0) representing a way 24 within the data array 22(0) of the set 12(0) is provided to the encoder 18(0). The encoder 18(0) converts the 4-bit word 28(0) into the 2-bit encoded word 16(0) prior to providing the way 24 information to the prediction array 14(0). Such a conversion is performed, because the prediction array 14(0) stores the way 24 information associated with the data array 22(0) as a 2-bit encoded word (e.g., the 2-bit predicted word 26(0)) to save storage area within the cache memory 10. Upon receiving the 2-bit encoded word 16(0), the prediction array 14(0) determines which way 24(0)-24(3) to select, and provides the 2-bit predicted word 26(0) to the decoder 20(0). The decoder 20(0) converts the 2-bit predicted word 26(0) into a one-hot, 4-bit decoded word 30(0), wherein the hot bit within the 4-bit decoded word 30(0) represents the way 24 to be selected within the data array 22(0). For instance, a value of "0001" may represent way 24(0), while a value of "1000" may represent way 24(3) of the data array 22(0). Once the 4-bit decoded word 30(0) has been provided to the data array 22(0), data within the selected way 24 may be provided to a cache output 32(0).

As evidenced by this example, the prediction array 14(0) only requires two storage elements for each way 24 entry, because the 2-bit predicted word 26(0) is encoded in 2 bits. However, when reading the 2-bit predicted word 26(0) from the prediction array 14(0), the 2-bit predicted word 26(0) must be decoded into the 4-bit decoded word 30(0) in order to select the desired way 24 in the data array 22(0). Thus, even though the prediction array 14(0) is configured to store 2-bit words rather than 4-bit words in an attempt to save area, the required decode function increases the latency incurred each time the way 24 information is read from the prediction array 14(0).

Moreover, in many applications executed by digital circuits, the read path to read memory is often the critical path. As previously described above, when storing encoded words that represent information such as memory addresses for memory access requests, a decoder is placed within the read path in order to generate the decoded word from the stored encoded word. If the read path is the critical path in memory for memory accesses, the time required to decode the encoded word causes an increase in read latency. Therefore, the overall latency of the memory is increased as a result of decoding the stored encoded word for every read operation.

SUMMARY OF THE DISCLOSURE

Embodiments disclosed in the detailed description include decoded $2^n$-bit bitcells in memory for storing decoded bits, and related systems and methods. Memory within a digital circuit receives and stores various types of information, such as memory addresses and cache way selects, which are used during operation. Such information may be stored in memory as n-bit encoded words, as opposed to $2^n$-bit decoded words, so as to reduce the circuit area required for storing such values. However, an encoded word must be decoded in order to use the information represented by the encoded word. While storing encoded words (rather than decoded words) may reduce circuit area, the time required to perform the decoding function increases memory read latency. Thus, the decoded $2^n$-bit bitcells disclosed herein are configured to store a decoded word rather than an encoded word, thereby reducing the memory read latency by removing the decoder logic from the read path. Embodiments of the decoded $2^n$-bit bitcell disclosed herein provide $2^n$ state nodes within one bitcell in order to store a $2^n$-bit decoded word. In this manner, using the decoded $2^n$-bit bitcell reduces the read path latency while storing a decoded word in a more area efficient manner than typical storage elements, such as, for example, a six transistor (6T) Static Random Access Memory (SRAM) bitcell storing a $2^n$-bit decoded word.

In one embodiment, the decoded $2^n$-bit bitcell is able to use $2^n$ state nodes to store a $2^n$-bit decoded word by taking advantage of the "one-hot" property of a decoded word (wherein "one-hot" means that only one bit of a decoded word stored in the $2^n$ state nodes will be at a hot level). More specifically, because a decoded word is a "one-hot" word, combinational logic can be provided in each state node to retain a bit to be stored in a state node as a function of the values stored in the other state nodes within the decoded $2^n$-bit bitcell. Because the decoded word is "one-hot," the combinational logic provides a hot logic level to the state node if every other state node in the decoded $2^n$-bit bitcell is at a non-hot logic level. Moreover, the combinational logic within a state node provides a non-hot logic level to the state node if any other state node is at a hot logic level. Thus, the combinational logic ensures that a change in one bit within the decoded word causes the remaining bits to update accordingly. Moreover, the combinational logic ensures that a decoded word written to the decoded $2^n$-bit bitcell retains its value until a subsequent write is performed. In this manner, the decoded $2^n$-bit bitcell is able to store a decoded word in a more area efficient manner than typical storage elements. Moreover, using the decoded $2^n$-bit bitcell in memory to store a decoded word allows the decoder logic to be removed from the read path, thus decreasing memory read latency.

As a non-limiting example, the memory employing the decoded $2^n$-bit bitcell may be a cache memory that indexes a data array if a received memory address is present in the cache memory. If the cache memory stores the memory address as an encoded word, then the memory address must be decoded before it can be used to access the requested portion of the data array, thus adding to the read latency. However, if the cache memory stores the memory address as a decoded word, the memory address may be used to access the requested portion of the data array without first performing a decode function. Thus, storing the memory address as a decoded word reduces the read latency by removing the time required for decoding.

In this regard, in one embodiment disclosed herein, a decoded $2^n$-bit bitcell in memory for storing decoded bits is provided. The decoded $2^n$-bit bitcell contains $2^n$ state nodes. Each state node includes a storage node configured to store a decoded bit of a $2^n$-bit decoded word. The storage node is also configured to provide the stored decoded bit to a read bitline when a read enable is asserted on a read wordline. The read bitline is coupled to a decoded word output. Each state node also includes an active decoded bit input coupled to its corresponding storage node. The active decoded bit input is configured to receive a decoded bit from the $2^n$-bit decoded word and store the decoded bit in the storage node when a write enable is asserted on a write wordline. Each state node is further comprised of $2^n-1$ passive decoded bit inputs, each of which is coupled to one of the $2^n-1$ remaining storage nodes. The $2^n-1$ passive decoded bit inputs are configured to receive $2^n-1$ decoded bits not received by the active decoded bit input. Each state node further includes a logic circuit that is configured to receive the $2^n-1$ decoded bits from the $2^n-1$ passive decoded bit inputs of the state node. The logic circuit is also configured to retain a decoded bit based on the received $2^n-1$ decoded bits and provide the decoded bit to a passive decoded bit output. The passive decoded bit output is coupled to the storage node so as to store the decoded bit in the storage node.

In another embodiment, a decoded $2^n$-bit bitcell in memory for storing decoded bits is provided. The decoded $2^n$-bit bitcell is comprised of means for storing each of $2^n$ decoded bits of a $2^n$-bit decoded word in one of $2^n$ state nodes. The decoded $2^n$-bit bitcell also comprises means for receiving a decoded bit from the $2^n$-bit decoded word of an n-bit encoded word on each of the $2^n$ state nodes. The decoded $2^n$-bit bitcell further comprises means for storing as the decoded bit in each of the $2^n$ state nodes the decoded bit received on an active decoded bit input on each of the $2^n$ state nodes in response to a write enable asserted on a write wordline. The decoded $2^n$-bit bitcell also comprises means for receiving $2^n-1$ decoded bits on each of the $2^n$ state nodes, the $2^n-1$ decoded bits being the $2^n-1$ decoded bits not received on the active decoded bit input of the given state node. The decoded $2^n$-bit bitcell also comprises means for retaining a decoded bit within each state node by performing a logic function on the received $2^n-1$ decoded bits. The decoded $2^n$-bit bitcell further comprises means for providing the decoded bit of each state node to the remaining $2^n-1$ state nodes. The decoded $2^n$-bit bitcell also comprises means for providing each of the $2^n$ decoded bits to one of $2^n$ decoded word outputs in response to a read enable asserted on a read wordline.

In another embodiment, a method for storing a $2^n$-bit decoded word in memory is disclosed. The method comprises storing each of $2^n$ decoded bits of a $2^n$-bit decoded word in one of $2^n$ state nodes. The method also comprises receiving a decoded bit from the $2^n$-bit decoded word of an n-bit encoded word on an active decoded bit input on each of the $2^n$ state nodes. The method also comprises receiving $2^n-1$ decoded bits on each of the $2^n$ state nodes, the $2^n-1$ decoded bits being the $2^n-1$ decoded bits not received on the active decoded bit input on the given state node. The method also comprises retaining a decoded bit within each state node by performing a logic function on the received $2^n-1$ decoded bits not received on the active decoded bit inputs. The method also comprises storing the decoded bit of each state node within the given state node in response to a write enable not being asserted on a write wordline. The method also comprises providing the decoded bit of each state node to the remaining $2^n-1$ state nodes. The method also comprises providing each of the $2^n$ decoded bits to one of $2^n$ decoded word outputs in response to a read enable asserted on a read wordline.

In another embodiment, a cache memory system is disclosed. The cache memory system comprises a plurality of sets, wherein each set is configured to be addressable by a set index. Each set within the cache memory system comprises a tag array comprising a plurality of decoded $2^n$-bit bitcells. Each tag array is configured to store a plurality of $2^n$-bit decoded words within the plurality of decoded $2^n$-bit bitcells, wherein each $2^n$-bit decoded word represents a cache way. Each tag array is further configured to provide a $2^n$-bit decoded word representing a selected cache way to a data array. Each decoded $2^n$-bit bitcell comprises $2^n$ state nodes. Each state node includes a storage node configured to store a decoded bit of a $2^n$-bit decoded word. The storage node is also configured to provide the stored decoded bit to a read bitline when a read enable is asserted on a read wordline. The read bitline is coupled to a decoded word output. Each state node also includes an active decoded bit input coupled to its corresponding storage node. The active decoded bit input is configured to receive a decoded bit from the $2^n$-bit decoded word and store the decoded bit in the storage node when a write enable is asserted on a write wordline. Each state node is further comprised of $2^n-1$ passive decoded bit inputs, each of which is coupled to one of the $2^n-1$ remaining storage nodes. The $2^n-1$ passive decoded bit inputs are configured to receive $2^n-1$ decoded bits not received by the active decoded bit input. Each state node further includes a logic circuit that is configured to receive the $2^n-1$ decoded bits from the $2^n-1$ passive decoded bit inputs of the state node. The logic circuit is also configured to retain a decoded bit based on the received $2^n-1$ decoded bits and provide the decoded bit to a passive decoded bit output. The passive decoded bit output is coupled to the storage node so as to store the decoded bit in the storage node. Each set within the cache memory system also comprises a data array. Each data array is configured to store data associated with a plurality of cache ways and receive the $2^n$-bit decoded word representing the selected cache way from the tag array. Each data array if further configured to provide the data from the selected cache way to a cache data output.

BRIEF DESCRIPTION OF THE FIGURES

FIG. 8 is a table diagram describing benefits of storing $2^n$-bit decoded words in memory employing the decoded $2^n$-bit bitcell in FIG. 3 as compared to storing n-bit encoded words in the memory row employing the 6T SRAM bitcells in FIG. 2.

DETAILED DESCRIPTION

Figure 1:
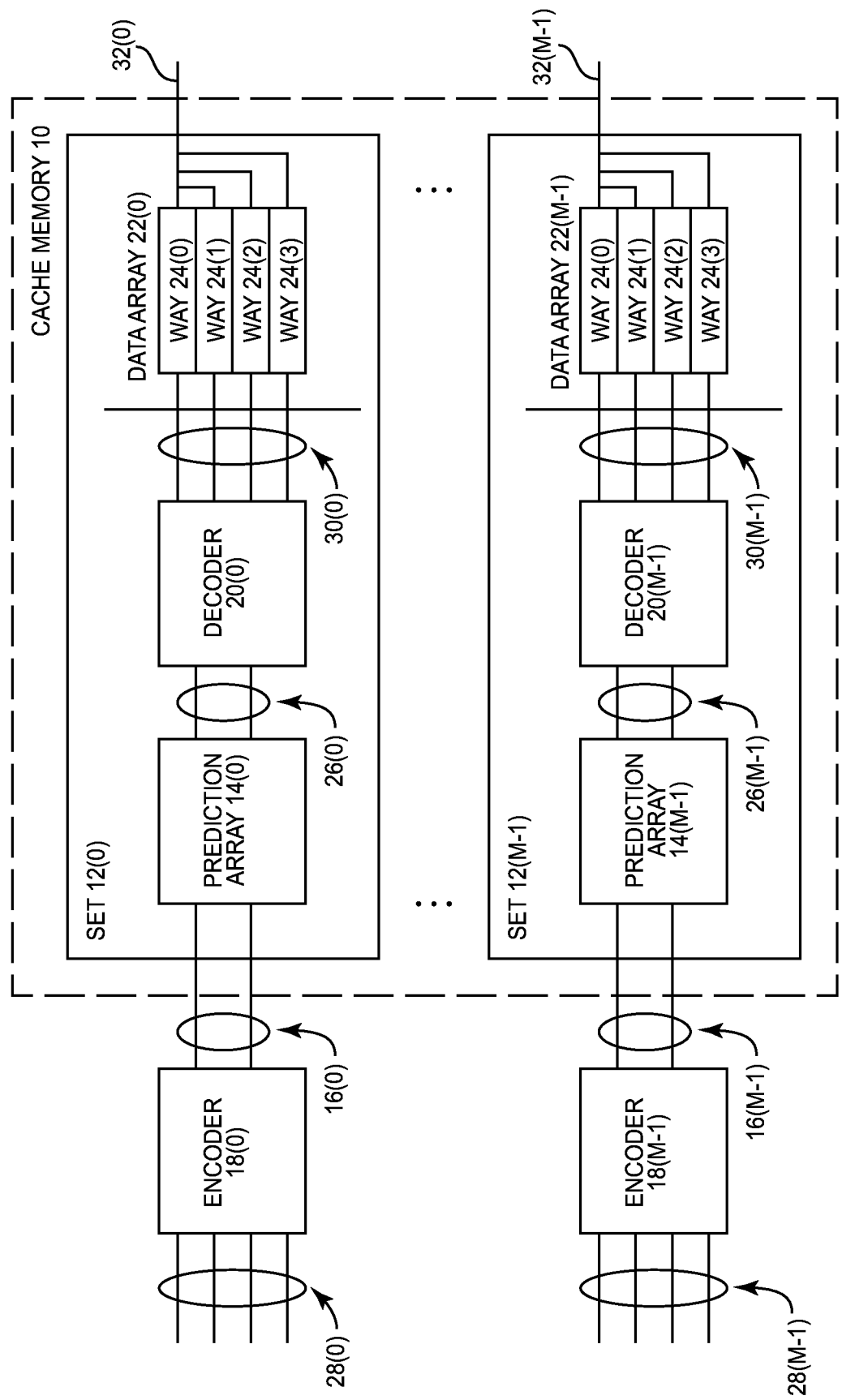
FIG. 1 is a block diagram of an exemplary cache memory employing six transistor (6T) Static Random Access Memory (SRAM) bitcells in order to store a 2-bit encoded word used to select a way within a cache set, accompanied by a required decoder.

With reference now to the drawing figures, several exemplary embodiments of the present disclosure are described.

The word "exemplary" is used herein to mean "serving as an example, instance, or illustration." Any embodiment described herein as "exemplary" is not necessarily to be construed as preferred or advantageous over other embodiments.

Embodiments disclosed in the detailed description include decoded $2^n$-bit bitcells in memory for storing decoded bits, and related systems and methods. Memory within a digital circuit receives and stores various types of information, such as memory addresses and cache way selects, which are used during circuit operation. Such information may be stored in memory as n-bit encoded words, as opposed to $2^n$-bit decoded words, so as to reduce the circuit area required for storing such values. However, an encoded word must be decoded in order to use the information represented by the encoded word. While storing encoded words (rather than decoded words) may reduce circuit area, the time required to perform the decoding function increases memory read latency. Thus, the decoded $2^n$-bit bitcells disclosed herein are configured to store a decoded word rather than an encoded word, thereby reducing the memory read latency by removing the decoder logic from the read path. Embodiments of the decoded $2^n$-bit bitcell disclosed herein provide $2^n$ state nodes within one bitcell in order to store a $2^n$-bit decoded word. In this manner, using the decoded $2^n$-bit bitcell reduces the read path latency while storing a decoded word in a more area efficient manner than typical storage elements, such as, for example, a six transistor (6T) Static Random Access Memory (SRAM) bitcell (also referred to as "6T bitcells") storing a $2^n$-bit decoded word.

In one embodiment, as will be discussed in more detail below, the decoded $2^n$-bit bitcell is able to use $2^n$ state nodes to store a $2^n$-bit decoded word by taking advantage of the "one-hot" property of a decoded word (wherein "one-hot" means that only one bit of a decoded word stored in the $2^n$ state nodes will be at a hot level). More specifically, because a decoded word is a "one-hot" word, combinational logic can be provided in each state node to generate and retain a bit to be stored in a state node as a function of the values stored in the other state nodes within the decoded $2^n$-bit bitcell. Because the decoded word is "one-hot," the combinational logic provides a hot logic level to the state node if every other state node in the decoded $2^n$-bit bitcell is at a non-hot logic level. Moreover, the combinational logic within a state node provides a non-hot logic level to the state node if any other state node is at a hot logic level. Thus, the combinational logic ensures that a change in one bit within the decoded word causes the remaining bits to update accordingly. Moreover, the combinational logic ensures that a decoded word written to the decoded $2^n$-bit bitcell retains its value until a subsequent write is performed. In this manner, the decoded $2^n$-bit bitcell is able to store a decoded word in a more area efficient manner than typical storage elements. Moreover, using the decoded $2^n$-bit bitcell in memory to store a decoded word allows the decoder logic to be removed from the read path, thus decreasing memory read latency.

Figure 2:
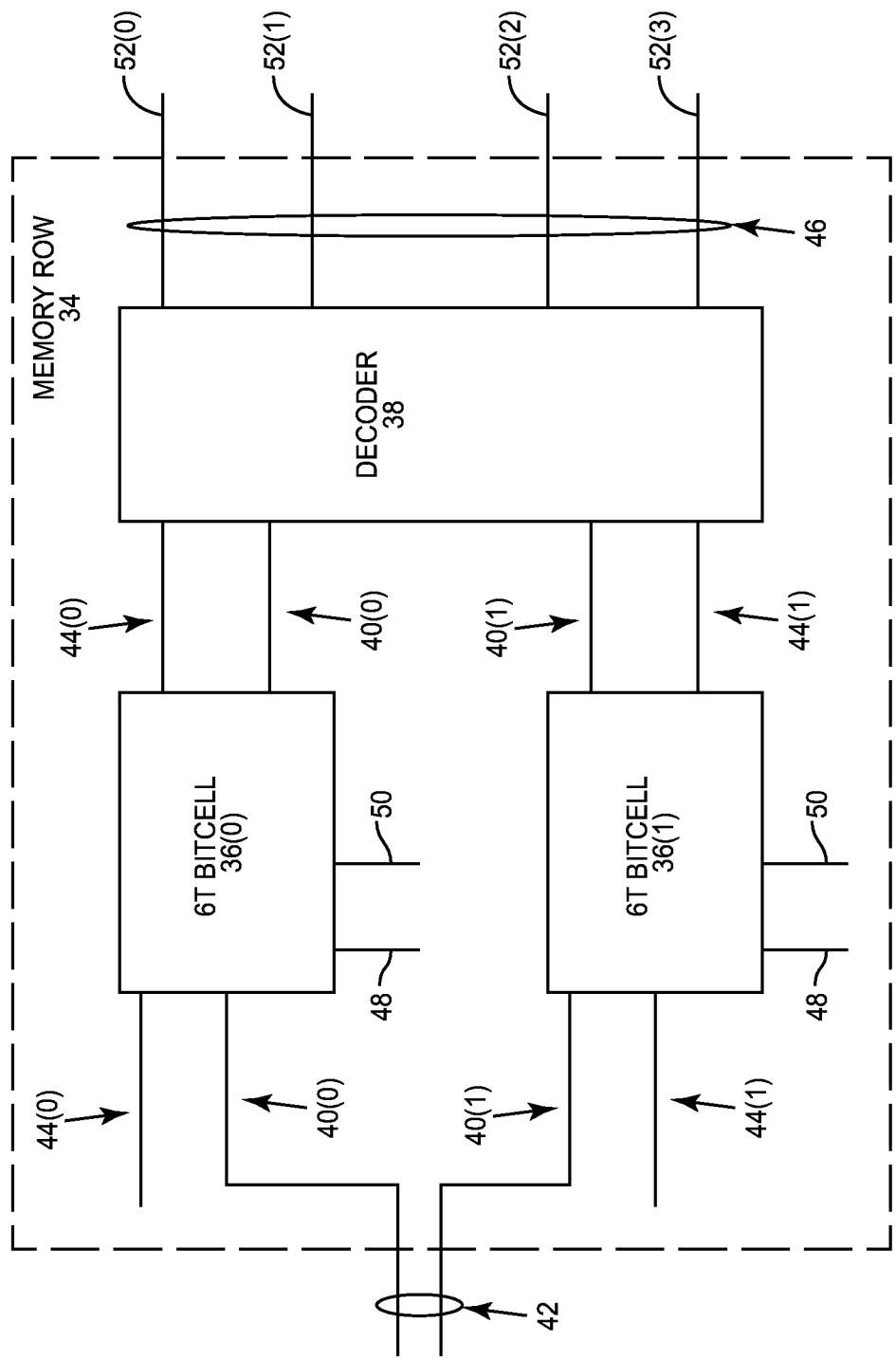
FIG. 2 is a block diagram of an exemplary memory row employing 6T SRAM bitcells configured to store a 2-bit encoded word accompanied by a decoder.

Prior to discussing the details of the decoded $2^n$-bit bitcells disclosed herein, an exemplary memory row configured to store an encoded word is first described to illustrate the additional memory access latency involved in decoding the stored encoded word. In this regard, FIG. 2 illustrates a memory row 34 employing 6T bitcells to store an encoded word. For example, the encoded word may be used by the memory row 34 to select an address location in a cache memory as part of a memory access. More specifically, the memory row 34 includes two 6T bitcells 36(0)-36(1) and a decoder 38. Each 6T bitcell 36(0)-36(1) is configured to store one encoded bit 40(0)-40(1) of a 2-bit encoded word 42, as well as each encoded bit complement 44(0)-44(1). Moreover, the decoder 38 is provided to decode the 2-bit encoded word 42 and provide a 4-bit decoded word 46 when the memory row 34 is read.

With continuing reference to FIG. 2, when writing an encoded value to the memory row 34, each encoded bit 40(0)-40(1) of the 2-bit encoded word 42 is stored in the corresponding 6T bitcell 36(0)-36(1) upon an active value being received on a write wordline 48. Similarly, each encoded bit complement 44(0)-44(1) is also stored in the corresponding 6T bitcell 36(0)-36(1) for a write operation. However, before the 2-bit encoded word 42 can be read and used by another circuit that communicates with the memory row 34, the 2-bit encoded word 42 must be decoded into the 4-bit decoded word 46. In this manner, for a read operation, each encoded bit 40(0)-40(1) and encoded bit complement 44(0)-44(1) is provided to the decoder 38 when an active value is placed on a read wordline 50. The decoder 38 uses the encoded bits 40(0)-40(1) and the encoded bit complements 44(0)-44(1) to produce the 4-bit decoded word 46. The 4-bit decoded word 46 is provided to decoded outputs 52(0)-52(3) so as to be accessed by another circuit.

Figure 3:
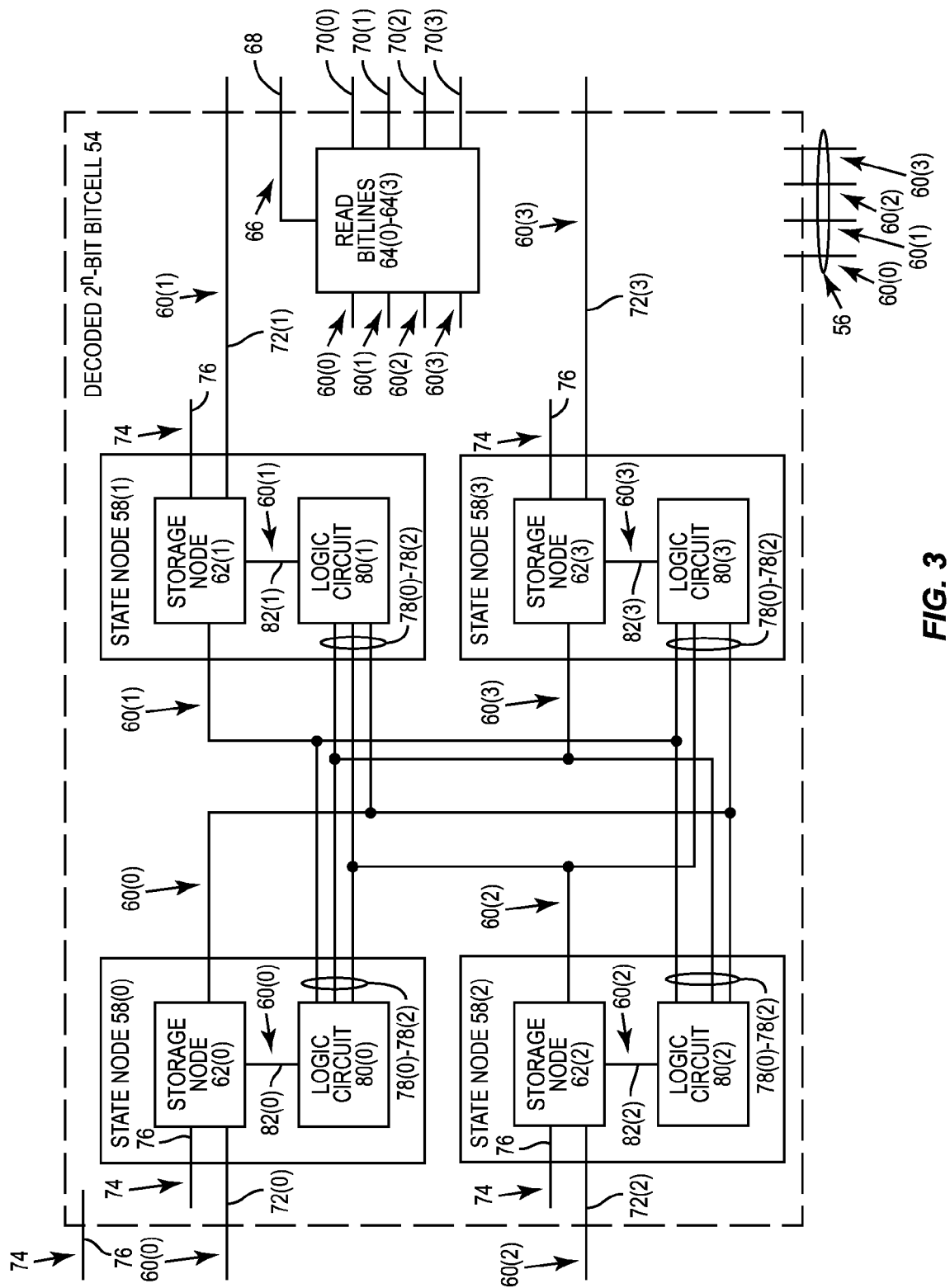
FIG. 3 is a block diagram of an exemplary decoded $2^n$-bit bitcell configured to store decoded words in memory in an area efficient manner while reducing read path latency as compared to storing an equivalent encoded word.

As evidenced by this example of the memory row 34 in FIG. 2, with the two 6T bitcells 36(0)-36(1) provided to store the 2-bit encoded word 42, the read path latency for each read operation includes the latency involved in the decoder 38 converting the 2-bit encoded word 42 into the 4-bit decoded word 46. The decoder 38 and its associated latency may be removed from the read path if the 4-bit decoded word 46 is stored in decoded form. However, this configuration would require four 6T bitcells 36 rather than just the two 6T bitcells 36(0)-36(1) in this example, thus increasing the circuit area required for the storage elements. Instead of storing the decoded word 46 as the equivalent encoded word 42 in the memory row 34, FIG. 3 illustrates an exemplary decoded $2^n$-bit bitcell 54 used in memory to store a decoded word. In this manner, a decoder like the decoder 38 in the memory row 34 in FIG. 2 is not required to decode an encoded word used as part of a memory read access.

In this regard, FIG. 3 illustrates a single decoded $2^n$-bit bitcell 54 configured to store $2^n$ bits of a $2^n$-bit decoded word, where "n" is the number of bits of the corresponding encoded word. As described in more detail below, each decoded $2^n$-bit bitcell 54 comprises $2^n$ state nodes, wherein each state node corresponds to a stored decoded bit. Each state node is comprised of a storage node and a logic circuit. The storage node within each state node stores a decoded bit (as opposed to an encoded bit) of the $2^n$-bit decoded word. Further, as described in more detail below, each logic circuit takes advantage of a logical relationship of only one-hot bit being provided in a decoded word (e.g., the decoded word "1000," where bit "1" is a hot bit) in order to generate and retain the value of the decoded bit within the corresponding storage node. In this manner, the decoded $2^n$-bit bitcell 54 is able to store all $2^n$ bits of a $2^n$-bit decoded word. As described in more detail below, the single decoded $2^n$-bit bitcell 54 is able to store $2^n$ decoded bits using fewer transistors as compared to storing the same $2^n$ decoded bits in $2^n$ 6T bitcells 36. Moreover, because the decoded $2^n$-bit bitcell 54 in FIG. 3 stores decoded bits, the decoded $2^n$-bit bitcell 54 does not require the decoder 38 in FIG. 2 (nor the associated latency) in order to decode a stored decoded word. In this regard, the decoded $2^n$-bit bitcell 54 can store decoded words within memory in a more area efficient manner than the 6T bitcell 36, allowing the decoder 38 to be removed from the read path, thereby reducing read path latency.

In this regard, with continuing reference to FIG. 3, 'n' equals two (2) in this example, meaning that the decoded $2^n$-bit bitcell 54 is configured to store a 4-bit decoded word 56. The decoded $2^n$-bit bitcell 54 contains $2^n$ state nodes 58(0)-58(3). Each state node 58(0)-58(3) corresponds to a decoded bit 60(0)-60(3) of the 4-bit decoded word 56 in this example; however, the decoded $2^n$-bit bitcell 54 is not limited to a 4-bit bitcell. Each state node 58(0)-58(3) in FIG. 3 includes a storage node 62(0)-62(3) configured to store a decoded bit 60(0)-60(3). Each storage node 62(0)-62(3) is also configured to provide its corresponding stored decoded bit 60(0)-60(3) to a read bitline 64(0)-64(3) when a read enable 66 is asserted on a read wordline 68. Each read bitline 64(0)-64(3) is coupled to decoded word outputs 70(0)-70(3), each of which corresponds to a decoded bit 60(0)-60(3). Moreover, each state node 58(0)-58(3) also includes an active decoded bit input 72(0)-72(3), which is coupled to its corresponding storage node 62(0)-62(3). In this regard, an "active" input means that a decoded bit received on the input is written from the input directly into its storage destination. For example, each storage node 58(0)-58(3) in FIG. 3 represents a storage destination. Thus, a decoded bit 60(0)-60(3) received on the active decoded bit input 72(0)-72(3) is written directly to the corresponding storage node 58(0)-58(3) during a write operation. As described in more detail below, the active decoded bit input 72(0)-72(3) is configured to receive a decoded bit 60(0)-60(3) from the 4-bit decoded word 56 and store the decoded bit 60(0)-60(3) in its storage node 62(0)-62(3) when a write enable 74 is asserted on a write wordline 76.

With continuing reference to FIG. 3, because the decoded word 56 is a one-hot decoded word, the decoded $2^n$-bit bitcell 54 takes advantage of a logical relationship that exists among the decoded bits 60(0)-60(3). Taking advantage of this logical relationship allows the decoded $2^n$-bit bitcell 54 to generate and retain values in each storage node 58(0)-58(3). In this regard, each state node 58(0)-58(3) is further comprised of $2^n-1$ passive decoded bit inputs 78(0)-78(2), each of which is coupled to one of the $2^n-1$ remaining storage nodes 62. A "passive" input means that a decoded bit received on the input is not written from the input directly into its storage destination. Rather, as described in more detail below, a decoded bit received on a "passive" input is used to generate or retain a decoded bit stored in a storage destination. The $2^n-1$ passive decoded bit inputs 78(0)-78(2) of each state node 58(0)-58(3) are configured to receive the $2^n-1$ decoded bits 60 of the 4-bit decoded word 56 not received on the state node's 58 active decoded bit input 72. For example, the state node 58(0) receives the decoded bit 60(0) on its active decoded bit input 72(0). Therefore, the state node 58(0) receives the decoded bits 60(1)-60(3) on its passive decoded bit inputs 78(0)-78(2) from the storage nodes 62(1)-62(3), respectively. Each state node 58(0)-58(3) further includes a logic circuit 80(0)-80(3) that is configured to receive the $2^n-1$ decoded bits 60 from the $2^n-1$ passive decoded bit inputs 78(0)-78(2) of its corresponding state node 58. Each logic circuit 80(0)-80(3) is also configured to retain its decoded bit 60(0)-60(3) based on the received $2^n-1$ decoded bits 60, and provide it to a corresponding passive decoded bit output 82(0)-82(3). Each passive decoded bit output 82(0)-82(3) is coupled to its corresponding storage node 62(0)-62(3) so as to store the decoded bit 60(0)-60(3) in the storage node 62(0)-62(3).

With continuing reference to FIG. 3, in one embodiment, the decoded $2^n$-bit bitcell 54 stores a $2^n$-bit decoded word based on the following logical relationship:

$$a_i = !(a_0 + a_1 + \ldots a_{i-1} + a_{i+1} + \ldots a_m), \text{ where } m \text{ equals } 2^n - 1.$$

Thus, as a non-limiting example, Table 1 illustrates this logical relationship between the four decoded bits 60(0)-60(3) (where decoded bits 60(0)-60(3) correspond to ABCD, respectively) of the 4-bit decoded word 56 associated with a 2-bit encoded word.

TABLE 1

| Encoded Word | | A | B | C | D |
|---|---|---|---|---|---|
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

The resulting equations are thus:

$$A = !(B+C+D)$$

$$B = !(A+C+D)$$

$$C = !(A+B+D)$$

$$D = !(A+B+C)$$

With continuing reference to FIG. 3, as a non-limiting example, the 4-bit decoded word 56 may have a value of "1000" to be written into the decoded $2^n$-bit bitcell 54. In this manner, the decoded bit 60(0) has a logical value of "1," and the decoded bits 60(1)-60(3) all have a logical value of "0." Each decoded bit 60(0)-60(3) is placed onto its corresponding active decoded bit input 72(0)-72(3). Upon the write enable 74 asserting on the write wordline 76, each decoded bit 60(0)-60(3) on the active decoded bit inputs 72(0)-72(3) is written directly into its corresponding storage node 62(0)-62(3).

However, when the write enable 74 is no longer asserted on the write wordline 76, the logical relationship previously described above and illustrated by Table 1, is implemented by each logic circuit 80(0)-80(3), allowing each storage node 62(0)-62(3) to retain the corresponding decoded bit 60(0)-60(3) received during the write operation. More specifically, as described in more detail below, each logic circuit 80(0)-80(3) within each state node 58(0)-58(3) receives each decoded bit 60 stored within each of the other state nodes 58. Using the logical relationship described above, each logic circuit 80(0)-80(3) is able to retain the logical value of its corresponding decoded bit 60 based on the logical value of each of the remaining decoded bits 60. In this manner, the logic circuits 80(0)-80(3) enable the decoded $2^n$-bit bitcell 54 to retain the stored decoded bits 60(0)-60(3) using fewer transistors as compared to using 6T bitcells 36 to store the same number of bits. Thus, as described in more detail below, the decoded $2^n$-bit bitcell 54 is able to store and retain the decoded bits 60(0)-60(3) in a more area efficient manner than other storage elements, such as the 6T bitcell 36.

Further, a read operation may read the 4-bit decoded word 56 from the decoded $2^n$-bit bitcell 54 by asserting the read enable 66 on the read wordline 68. Upon assertion of the read enable 66, the decoded bits 60(0)-60(3), which are coupled from the storage nodes 62(0)-62(3) to the read bitlines 64(0)-64(3), are provided directly to the corresponding decoded word outputs 70(0)-70(3). Because the decoded bits 60(0)-60(3) are not encoded, the decoded bits 60(0)-60(3) do not require decoding prior to being provided to the decoded word outputs 70(0)-70(3). In this manner, the decoded $2^n$-bit bitcell 54 stores the 4-bit decoded word 56 in an area efficient manner without requiring the decoder 38 of the memory row 34 found in FIG. 2. Thus, the decoded $2^n$-bit bitcell 54 stores a value equivalent to the value stored in the memory row 34 in FIG. 2 while reducing the read path latency by the latency incurred by the decoder 38.

Moreover, as discussed in more detail below, should a subsequent write operation modify only one of the decoded bits 60(0)-60(3), each logic circuit 80(0)-80(3) ensures that the decoded bits 60(0)-60(3) stored in the storage nodes 62(0)-62(3) maintain the logical relationship previously described. For example, if a subsequent write operation places a logical "1" value for the decoded bit 60(3) onto the active decoded bit input 72(3), the logic circuits 80(0)-80(3) ensure that the decoded bits 60(0)-60(3) stored in the storage nodes 62(0)-62(3) have logical values of "0001," respectively.

Figure 4:
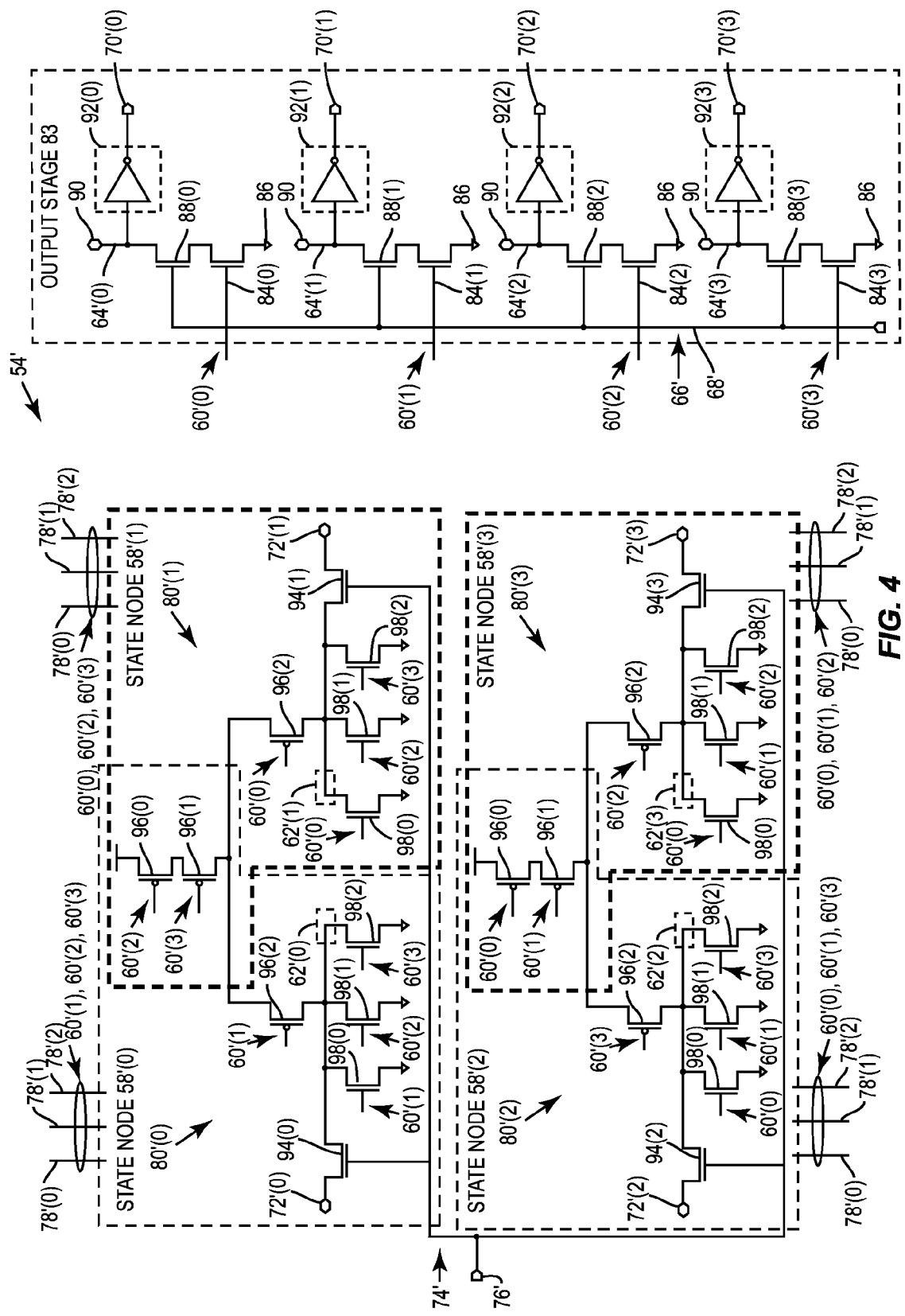
FIG. 4 is a circuit diagram of the decoded $2^n$-bit bitcell in FIG. 3.

FIG. 4 illustrates an exemplary embodiment of the decoded $2^n$-bit bitcell 54 in FIG. 3 as decoded $2^n$-bit bitcell 54'. The decoded $2^n$-bit bitcell 54' is a transistor level embodiment of the decoded $2^n$-bit bitcell 54 illustrated in FIG. 3 to further illustrate an example of how all $2^n$ bits of a $2^n$-bit decoded word may be stored and retained in an area efficient manner while avoiding decoding latency in the read path. Thus, the decoded $2^n$-bit bitcell 54' includes certain common components and circuits with the decoded $2^n$-bit bitcell 54 in FIG. 3. Such common components that have an associated number "X" in FIG. 3 are denoted by a number "X" in FIG. 4, and thus will not be re-described herein.

In this regard, with reference to FIG. 4, the decoded $2^n$-bit bitcell 54' stores a 4-bit decoded word 56'. The decoded $2^n$-bit bitcell 54' contains $2^n$ state nodes 58'(0)-58'(3), each corresponding to a decoded bit 60'(0)-60'(3) of the 4-bit decoded word 56' (not shown). Each state node 58'(0)-58'(3) includes a storage node 62'(0)-62'(3) configured to store a decoded bit 60'(0)-60'(3). During a read operation, each storage node 62'(0)-62'(3) is configured to provide its corresponding stored decoded bit 60'(0)-60'(3) to a read bitline 64'(0)-64'(3) when a read enable 66' is asserted on a read wordline 68'. For clarity, components relating to the read and output portions of the decoded $2^n$-bit bitcell 54' are illustrated in FIG. 4 within an output stage 83. In this embodiment, each stored decoded bit 60'(0)-60'(3) is provided to a corresponding active high read transistor 84(0)-84(3). Each active high read transistor 84(0)-84(3) is connected to a ground source 86 and a corresponding active high wordline transistor 88(0)-88(3). The active high wordline transistors 88(0)-88(3) are coupled to corresponding read bitlines 64'(0)-64'(3). Moreover, each read bitline 64'(0)-64'(3) is pre-charged to a logical '1' value by a voltage source 90, and is coupled to an inverter 92(0)-92(3). As illustrated in FIG. 4, the output of each inverter 92(0)-92(3) is coupled to a corresponding decoded word output 70'(0)-70'(3). In this manner, assertion of the read enable 66' on the read wordline 68' activates the active high wordline transistors 88(0)-88(3), which connects the read bitlines 64'(0)-64'(3) to the active high read transistors 84(0)-84(3). Moreover, the stored decoded bit 60'(0)-60'(3) that has a logical '1' value (e.g., a hot bit) activates the corresponding active high read transistor 84(0)-84(3) so that a logical '0' value (e.g., a ground voltage) is placed onto the respective read bitline 64'(0)-64'(3). Accordingly, the remaining read bitlines 64' remain at the pre-charged logical '1' value. As a result, the corresponding inverter 92(0)-92(3) corresponding to the hot decoded bit 60' provides a logical '1' value to the respective decoded word output 70'(0)-70'(3), while the remaining decoded word outputs 70' receive a logical '0' value.

Each state node 58'(0)-58'(3) also includes an active decoded bit input 72'(0)-72'(3) coupled to its corresponding storage node 62'(0)-62'(3). Each active decoded bit input 72'(0)-72'(3) is configured to receive a decoded bit 60'(0)-60'

(3) that it stores in the corresponding storage node 62'(0)-62'(3) when a write enable 74' is asserted on a write wordline 76'. More specifically, when the write enable 74' is asserted, each active high write transistor 94(0)-94(3) is activated. This allows each active decoded bit input 72'(0)-72'(3) to place each decoded bit 60'(0)-60'(3) into the corresponding storage node 62'(0)-62'(3). Each state node 58'(0)-58'(3) is further comprised of $2^n-1$ passive decoded bit inputs 78'(0)-78'(2) coupled to the $2^n-1$ remaining storage nodes 62'. Similar to the elements discussed in FIG. 3, the $2^n-1$ passive decoded bit inputs 78'(0)-78'(2) of each state node 58'(0)-58'(3) are configured to receive the $2^n-1$ decoded bits 60' of the 4-bit decoded word 56' not received on the state node's 58' active decoded bit input 72'.

With continuing reference to FIG. 4, each state node 58'(0)-58'(3) further includes a logic circuit 80'(0)-80'(3) that is configured to receive the $2^n-1$ decoded bits 60' from the $2^n-1$ passive decoded bit inputs 78'(0)-78'(2) of the corresponding state node 58'. In this embodiment, each logic circuit 80'(0)-80'(3) includes three active low receiving transistors 96(0)-96(2) and three active high receiving transistors 98(0)-98(2). So as to minimize the circuit area required for the decoded $2^n$-bit bitcell 54', the logic circuits 80'(0) and 80'(1) share two common active low receiving transistors 96(0)-96(1). Similarly, the two active low receiving transistors 96(0)-96(1) are shared between the logic circuits 80'(2)-80'(3) to achieve the same circuit area savings. In this manner, in this example the active low and active high receiving transistors 96(0)-96(2) and 98(0)-98(2), respectively, are configured to perform a NOR function on the corresponding decoded bits 60' received by each logic circuit 80'(0)-80'(3), and store the results in the storage nodes 62'(0)-62'(3). In performing such a NOR function in this example, each logic circuit 80'(0)-80'(3) is configured to retain its decoded bit 60'(0)-60'(3) based on the received $2^n-1$ decoded bits 60', and provide it to a corresponding passive decoded bit output 82'(0)-82'(3) (not shown). Thus, if one or more bits are received on the active decoded bit inputs 72'(0)-72'(3), the logic circuits 80'(0)-80'(3) ensure that the decoded $2^n$-bit bitcell 54' maintains the logical relationship described above in Table 1 for the decoded bits 60'(0)-60'(3). In this manner, the decoded $2^n$-bit bitcell 54' stores the 4-bit decoded word 56' in an area efficient manner without requiring the decoder 38 of the memory row 34 found in FIG. 2, thereby reducing the read path latency by the latency incurred by the decoder 38.

It should be appreciated that while the logic circuits 80'(0)-80'(3) in the decoded $2^n$-bit bitcell 54' in FIG. 4 are configured to perform a NOR function on the decoded bits 60', the logic circuits 80'(0)-80'(3) may be configured to perform any other "OR-based" or "AND-based" function, such as a NAND function for example, in order to implement the logical relationship previously described. However, if the logic circuits 80'(0)-80'(3) are configured to perform a NAND function as an example, the 4-bit decoded word 56' will be a version of one-hot referred to as "zero-hot." A word is "zero-hot" when only one bit within the word is at a non-hot logic level, while the remaining bits in the word are each at a hot logic level. As a non-limiting example, a 2-bit encoded word "00" may represent a zero-hot, 4-bit decoded word "1110," where the value "0" represents a zero-hot (also referred to as non-hot) logic level. While configuring the logic circuits 80'(0)-80'(3) to perform a NAND function results in the 4-bit decoded word 56' being zero-hot, such a configuration provides the same benefits as achieved when using a NOR function.

It should also be appreciated that while the decoded $2^n$-bit bitcell 54 in FIG. 3 and the decoded $2^n$-bit bitcell 54' in FIG. 4 are each configured to store a one-hot 4-bit decoded word (e.g., 'n' equals 2, thus $2^n$ equals 4), the decoded $2^n$-bit bitcell 54 and the decoded $2^n$-bit bitcell 54' may be configured to store a one-hot decoded word of any bit length. For example, if the decoded $2^n$-bit bitcell 54 in FIG. 3 is configured to store a $2^n$-bit decoded word (where 'n' is the number of bits in an equivalent encoded word), the decoded $2^n$-bit bitcell 54 will have $2^n$ state nodes 58. Moreover, each of the $2^n$ state nodes 58 will have an active decoded bit input 72, as well as $2^n-1$ passive decoded bit inputs on which to receive decoded bits from the $2^n-1$ storage nodes 62 of the remaining state nodes 58. In this manner, each logic circuit 80 within each state node 58 will enforce the logical relationship previously described in order to retain the value of each bit within the $2^n$-bit decoded word.

Figure 5A:
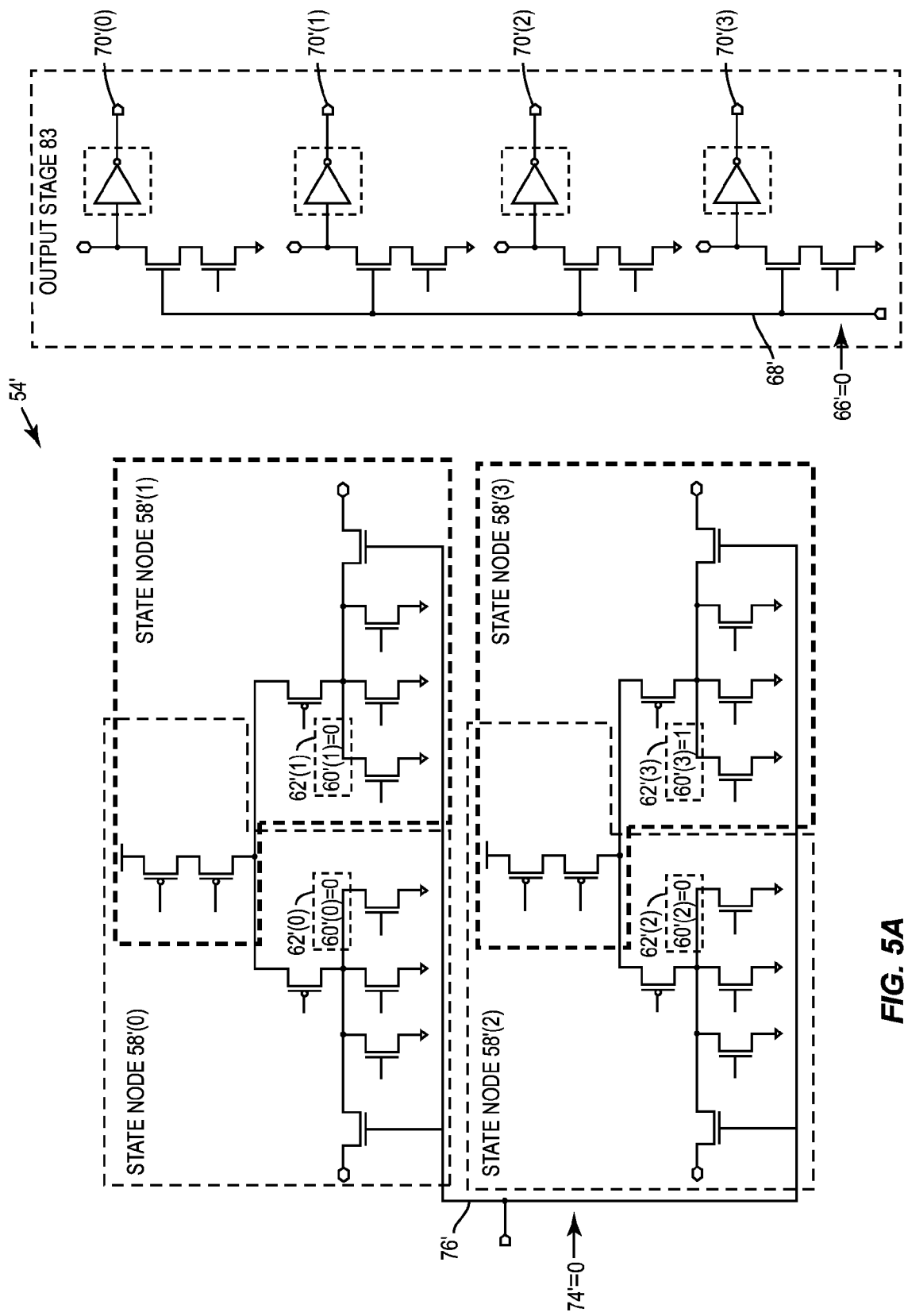
FIGS. 5A-5C illustrate operational instances of the circuit diagram of the decoded $2^n$-bit bitcell in FIG. 3 writing a one-hot decoded word to the decoded $2^n$-bit bitcell, while the decoded $2^n$-bit bitcell retains the value of each bit of the decoded word based on a reinforcing logical relationship between each decoded bit.
Figure 5B:
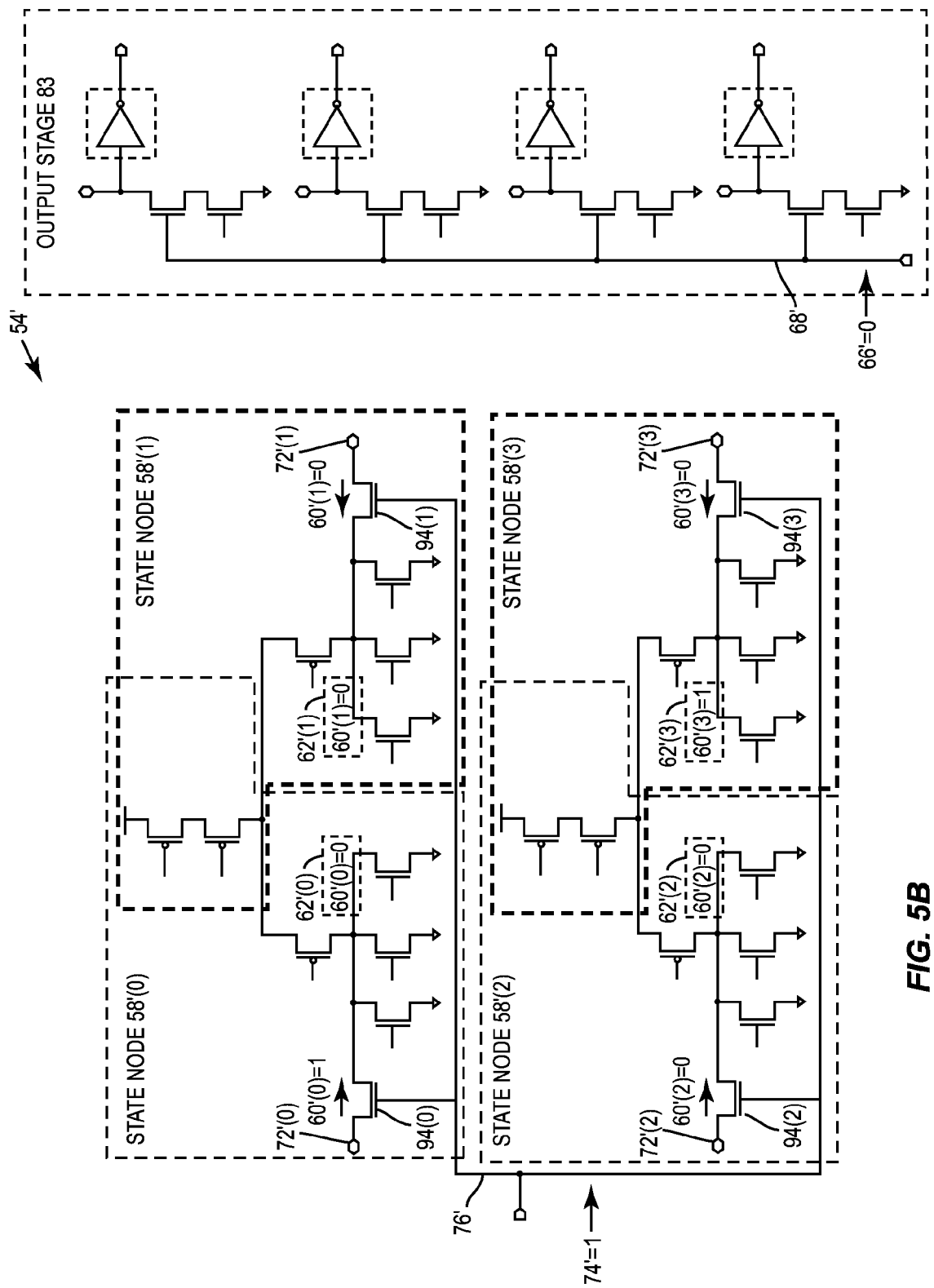
Figure 5C:
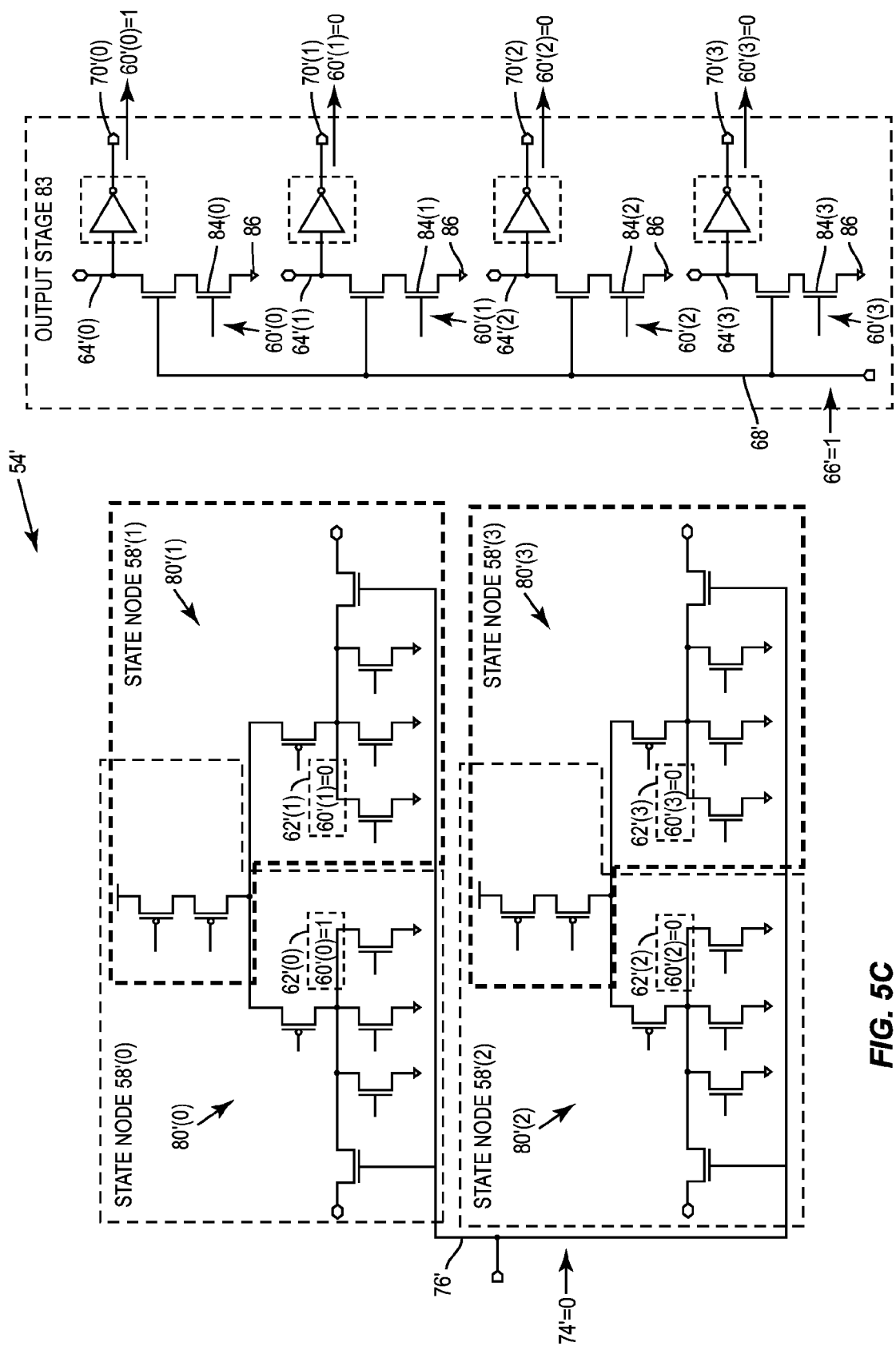

In this regard, FIGS. 5A-5C illustrate various states of the decoded $2^n$-bit bitcell 54' in FIG. 4 during a sequence of write and read operations with example values for the decoded bits 60'(0)-60'(3), active decoded bit inputs 72'(0)-72'(3), write enable 74', read enable 66', and decoded word outputs 70'(0)-70'(0) noted in the figures.

With reference to FIG. 5A, the decoded $2^n$-bit bitcell 54' has a 4-bit decoded word 56' (not shown) with a logical value of "0001" stored as the decoded bits 60'(0)-60'(3), respectively. In this manner, the decoded bits 60'(0)-60'(2) each have a logical '0' value, while the decoded bit 60'(3) has a logical '1' value. Further, each storage node 62'(0)-62'(3) retains its current decoded bit 60'(0)-60'(3) using the logical relationship as previously described, as no write operation is being performed because the write enable 74' is not asserted (e.g., it does not have a logical '1' value) on the write wordline 76'. Similarly, because the read enable 66' is not asserted on the read wordline 68', no read operation is causing the decoded bits 60'(0)-60'(3) to be placed onto the decoded word outputs 70'(0)-70'(3).

FIG. 5B illustrates the details of a write operation performed on the decoded $2^n$-bit bitcell 54'. More specifically, the write operation changes the 4-bit decoded word 56' (not shown) stored by the decoded $2^n$-bit bitcell 54' from a value of "0001" to "1000." As such, while the write enable 74' is asserted to a logical '1' value on the write wordline 76', the active decoded bit input 72'(0) of state node 58'(0) receives a logical '1' value from decoded bit 60'(0). Further, the active decoded bit inputs 72'(1)-72'(3) of the remaining state nodes 58'(1)-58'(3) each receive a logical '0' value from the decoded bits 60'(1)-60'(3), respectively. The write enable 74' activates the active high write transistors 94(0)-94(3), allowing the decoded bits 60'(0)-60'(3) to be placed from the active decoded bit inputs 72'(0)-72'(3) into the storage nodes 62'(0)-62'(3). There is no value placed onto the decoded word outputs 70'(0)-70'(3) because the read enable 66' is not asserted on the read wordline 68'.

FIG. 5C illustrates the result of the write operation referenced in FIG. 5B. More specifically, the decoded bit 60'(0) stored in the storage node 62'(0) has a logical '1' value following the write operation, as a logical '1' value was received from the active decoded bit input 72'(0). Further, the decoded bits 60'(1)-60'(3) stored in the storage nodes 62'(1)-62'(3) each have a logical '0' value based on the values received on the respective active decoded bit inputs 72'(1)-72'(3) while the write enable 74' was asserted. Because the write enable 74' is no longer asserted in the decoded $2^n$-bit bitcell 54' in FIG. 5C (e.g., it has a logical '0' value), the logic circuits 80'(0)-80'(3) ensure that each storage node 62'(0)-62'(3) retains the decoded bits 60'(0)-60'(3) using the logical relationship previously described above. However, in the scenario where only one decoded bit 60' is received on the active decoded bit input 72' during a write operation, as opposed to writing all four decoded bits 60'(0)-60'(3) as in this example, the logic circuits 80' of the non-written state nodes 58' would generate the remaining decoded bits 60' based on the logical relationship employed by the logic circuits 80'.

With continuing reference to FIG. 5C, the result of a read operation performed on the decoded $2^n$-bit bitcell 54' is illustrated. More specifically, a read operation initiates when the read enable 66' is asserted (e.g., it has a logical '1' value) on the read wordline 68'. Each storage node 62'(0)-62'(3) provides its decoded bit 60'(0)-60'(3) to the corresponding active high read transistor 84(0)-84(3). Because only the decoded bit 60'(0) has a logical '1' value, only the active high read transistor 84(0) is activated, placing a logical '0' value from the ground voltage 86 onto the read bitline 64'(0). Accordingly, the remaining read bitlines 64'(1)-64'(3) retain the precharged logical '1' value. Each read bitline 64'(0)-64'(3) is inverted by the corresponding inverter 92(0)-92(3), allowing the value of the decoded bits 60'(0)-60'(3) to be placed onto the decoded word outputs 70'(0)-70'(3). Thus, the read operation allows the decoded $2^n$-bit bitcell 54' to provide the 4-bit decoded word 56' "1000" written during the write operation illustrated in FIG. 5B as an output. Thus, as previously described, the decoder 38 in FIG. 2 is not required for reading the decoded $2^n$-bit bitcell 54', which reduces the read path latency while storing the decoded bits 60'(0)-60'(3) in an area efficient manner.

As a non-limiting example, the memory employing the decoded $2^n$-bit bitcell 54' in FIGS. 5A-5C may be a cache memory that indexes a data array if a received memory address is present in the cache memory. If the cache memory stores the memory address as an encoded word, then the memory address must be decoded before it can be used to access the requested portion of the data array, thus adding to the read latency. However, if the cache memory stores the memory address as a decoded word, the memory address may be used to access the requested portion of the data array without first performing a decode function. Thus, storing the memory address as a decoded word reduces the read latency by removing the time required for decoding, as opposed to the read latency experienced when storing an encoded word in a different storage element, such as the 6T bitcell 36.

Figure 6:
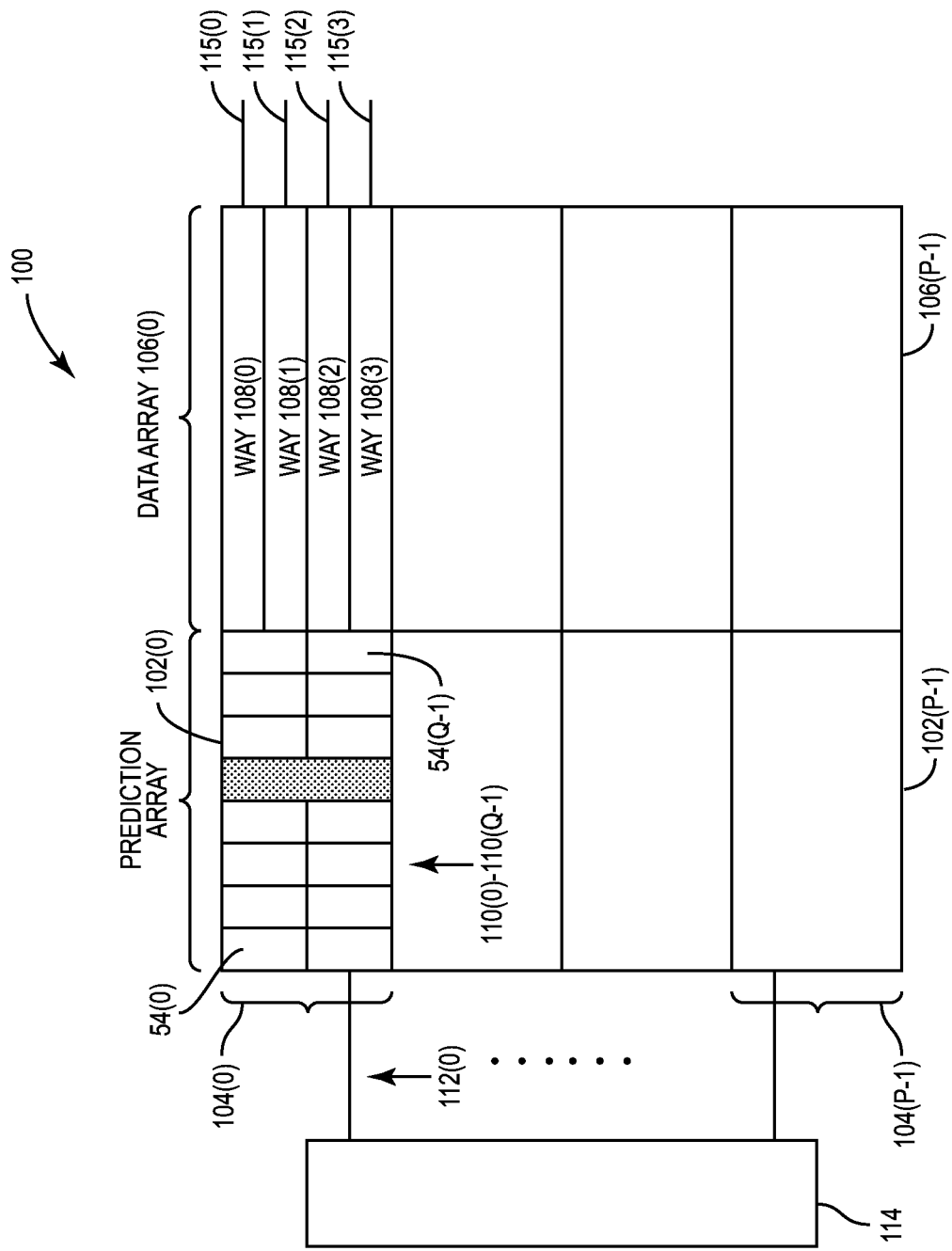
FIG. 6 is an exemplary cache memory employing decoded $2^n$-bit bitcells like the decoded $2^n$-bit bitcells in FIG. 3 for storing decoded words used to select a cache way in a data array for a cache memory access.

In this manner, FIG. 6 illustrates an exemplary cache memory 100 employing either the decoded $2^n$-bit bitcell 54 in FIG. 3 or the decoded $2^n$-bit bitcell 54' in FIG. 4 within a prediction array 102. As illustrated in FIG. 6, the cache memory 100 includes a plurality of sets 104(0)-104(P−1), wherein 'P' is a positive whole number such that the number of the plurality of sets 104 is 'P'. Each set 104(0)-104(P−1) includes a prediction array 102(0)-102(P−1) that employs a plurality of decoded $2^n$-bit bitcells 54(0)-54(Q−1), where 'Q' is a positive whole number such that the number of the plurality of decoded $2^n$-bit bitcells 54 in each prediction array 102 is 'Q'. Further, each set 104(0)-104(P−1) includes a data array 106(0)-106(P−1), wherein each data array 106(0)-106(P−1) is divided into four ways 108(0)-108(3). The way 108 information (not shown) for each set 104(0)-104(P−1) is stored as 4-bit predicted words 110(0)-110(Q−1) within each prediction array 102(0)-102(P−1).

With continuing reference to FIG. 6, using components relating only to set 104(0) of the cache memory 100 as an example, a 4-bit decoded word 112(0) representing a way 108 within the data array 106(0) is written to the decoded $2^n$-bit bitcell 54(0) within the prediction array 102(0) by a write driver 114. However, this example is equally applicable to the other sets 104(1)-104(P−1). Upon receiving the 4-bit decoded word 112(0), the prediction array 102(0) determines which way 108(0)-108(3) to select, and provides the 4-bit predicted word 110(0) directly to the data array 106(0). Because the prediction array 102(0) employs the decoded $2^n$-bit bitcell 54 in FIG. 3 as opposed to the 6T bitcell 36 in FIG. 2, it is not necessary to decode the 4-bit predicted word 110(0) after reading it from the prediction array 102(0). Thus, the decoder 38 in FIG. 2 is not required, thereby reducing the read path latency incurred when reading the prediction array 102(0). The 4-bit predicted word 110(0) selects the way 108 within the data array 106(0), allowing the data array 106(0) to provide data from the desired way 108 on its corresponding data outputs 115(0)-115(3). In this manner, employing the decoded $2^n$-bit bitcell 54 in the prediction array 102(0) allows the cache memory 100 to store and access way 108 information in an area efficient manner while reducing the read path latency as compared to using the 6T bitcells 36 in FIG. 2.

Figure 7:
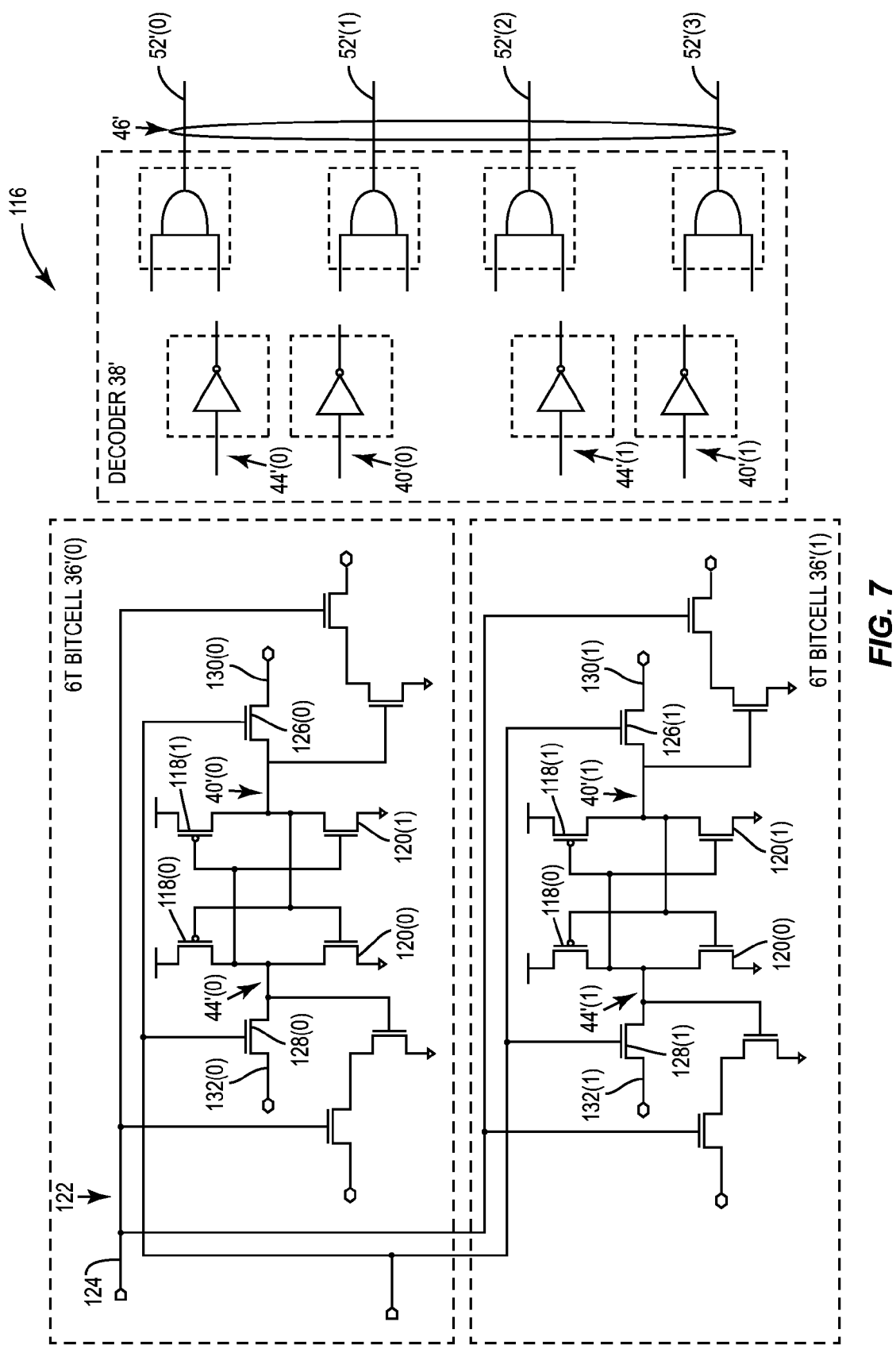
FIG. 7 is a circuit diagram of the exemplary memory row in FIG. 2 employing 6T SRAM bitcells for storing an encoded word, accompanied by a required decoder, for comparison to the decoded $2^n$-bit bitcell in FIG. 3.

Employing the decoded $2^n$-bit bitcell 54 in FIG. 3 in memory rather than storing encoded words in the traditional 6T bitcells 36 in FIG. 2 provides benefits in addition to the area efficiency and reduced read path latency previously discussed. However, before discussing such benefits below, the details of storing an encoded word using the 6T bitcells 36 are first described. In this regard, FIG. 7 illustrates an exemplary memory 116 employing 6T bitcells 36'(0)-36'(1) to store a 2-bit encoded word 42' (not shown). Each 6T bitcell 36'(0)-36'(1) stores an encoded bit 40'(0)-40'(1) and an encoded bit complement 44'(0)-44'(1), respectively, of the 2-bit encoded word 42'. The 6T bitcell 36' is a transistor level embodiment of the 6T bitcell 36 illustrated in FIG. 2. Thus, the 6T bitcell 36' includes certain common components and circuits with the 6T bitcell 36' in FIG. 2. Such common components that have an associated number "X" in FIG. 2 are denoted by a number "X" in FIG. 7.

In order to retain the value of such stored bits, each 6T bitcell 36'(0)-36'(1) cross-couples two active low transistors 118(0)-118(1) and two active high transistors 120(0)-120(1), as illustrated in FIG. 7. This is in contrast to the storage mechanism in the decoded $2^n$-bit bitcell 54 in FIG. 3, which retains stored values by using the logic circuits 80 to implement the logical relationship previously described. Further, when reading the encoded bits 40'(0)-40'(1) from the memory 116, such bits must be decoded before being provided to a circuit. Thus, upon assertion of a read enable 122 (e.g., a logical '1' value) on a read wordline 124, each active high read transistor 126(0)-126(1) and active high read comp transistor 128(0)-128(1) is activated. As a result, a value on each encoded bitline 130(0)-130(1) and encoded comp bitline 132(0)-132(1) is transferred to the decoder 38', rather than directly to the decoded outputs 52'(0)-52'(3). Only after the values provided by each 6T bitcell 36'(0)-36'(1) are decoded is a 4-bit decoded word 46' placed onto the decoded outputs 52'(0)-52'(3).

In this regard, FIG. 8 illustrates a table diagram 134 that describes the advantages of using the decoded $2^n$-bit bitcell 54 in FIG. 3 (and thus, the decoded $2^n$-bit bitcell 54' in FIG. 4) to store decoded bits rather than using the 6T bitcell 36 in FIG. 2 (and thus, the 6T bitcell 36' in FIG. 7) to store encoded bits. For clarity, only references to the decoded $2^n$-bit bitcell 54' in FIG. 4 and the 6T bitcell 36' in FIG. 7 are referenced below. As previously discussed, the decoded $2^n$-bit bitcell 54' provides a timing benefit as compared to the 6T bitcell 36'. More specifically, because the decoded $2^n$-bit bitcell 54' does not require the decoder 38' in the read path, the decoded $2^n$-bit bitcell 54' provides reduced read path latency as compared to storing encoded bits in the 6T bitcell 36'. Further, if both encoded bits 40'(0)-40'(1) of the memory 116 in FIG. 7 are changed from a logical '0' value to a logical '1' value, both encoded bitlines 130(0)-130(1) toggle values. However, due to the one-hot property of the 4-bit decoded word 56' stored by the decoded $2^n$-bit bitcell 54', a maximum of one read bitline 64' may toggle to a logical '1' value during any given operation. Thus, the read bitlines 64' of the decoded $2^n$-bit bitcell 54' may toggle up to fifty percent (50%) less than the encoded bitlines 130 of the 6T bitcell 36', resulting in reduced dynamic power in a memory that employs the decoded $2^n$-bit bitcell 54'.

With continuing reference to FIG. 8, because the 6T bitcell 36' stores both encoded bits 40'(0)-40'(1) and encoded bit complements 44'(0)-44'(1), the 6T bitcell 36' will always have two read stacks with a logical '1' value. However, the one-hot property of the 4-bit decoded word 56' stored by the decoded $2^n$-bit bitcell 54' allows for only one read stack to have a logical '1' value. Therefore, because a logical '1' value at the bottom of a read stack increases current leakage, the decoded $2^n$-bit bitcell 54' may reduce static power consumption up to fifty percent (50%) as compared to the 6T bitcell 36'. Moreover, the one-hot nature of the 4-bit decoded word 56' stored by the decoded $2^n$-bit bitcell 54' requires less shielding for the read bitlines 64' as compared to those of the 6T bitcell 36'. Thus, fewer wire resources are required in the decoded $2^n$-bit bitcell 54' to shield the read bitlines 64' from circuit noise.

With continuing reference to FIG. 8, the decoded $2^n$-bit bitcell 54' may be configured to employ the active low receiving transistors 96 in the logic circuits 80', as illustrated in the decoded $2^n$-bit bitcell 54' in FIG. 4. In this manner, if pmos transistors are employed as the active low receiving transistors 96, such a pmos transistor stack makes the resulting circuit path more resistive (e.g., weaker) than a single pmos transistor. Thus, the pmos transistor stack allows the active high receiving transistors 98 (e.g., nmos transistors) to be implemented at a smaller size. Thus, because less area is needed for the nmos transistors, sizing transistors within the decoded $2^n$-bit bitcell 54' pertaining to the writability of bits may be easier than sizing in the 6T bitcell 36'.

With continuing reference to FIG. 8, the 6T bitcell 36' may require less area for storing an encoded word than storing the equivalent decoded word in the decoded $2^n$-bit bitcell 54'. However, using the decoded $2^n$-bit bitcell 54' reduces the read path latency, as previously described, while storing a given number of decoded bits in less area as compared to storing the same number of decoded bits using the 6T bitcells 36'. For example, due to the area minimization achieved by employing the logical relationship previously described, storing four decoded bits in the decoded $2^n$-bit bitcell 54' requires less area than storing four decoded bits using four 6T bitcells 36'. More specifically, storing $2^n$ decoded bits in a single decoded $2^n$-bit bitcell 54' requires fewer transistors than storing $2^1$ decoded bits in $2^n$ 6T bitcells 36'. Thus, although the actual area of a single 6T bitcell 36' may be smaller than a single decoded $2^n$-bit bitcell 54', storing decoded bits in the decoded $2^n$-bit bitcell 54' is more area efficient.

The decoded $2^n$-bit bitcells in memory for storing decoded bits, and related systems and methods according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 9:
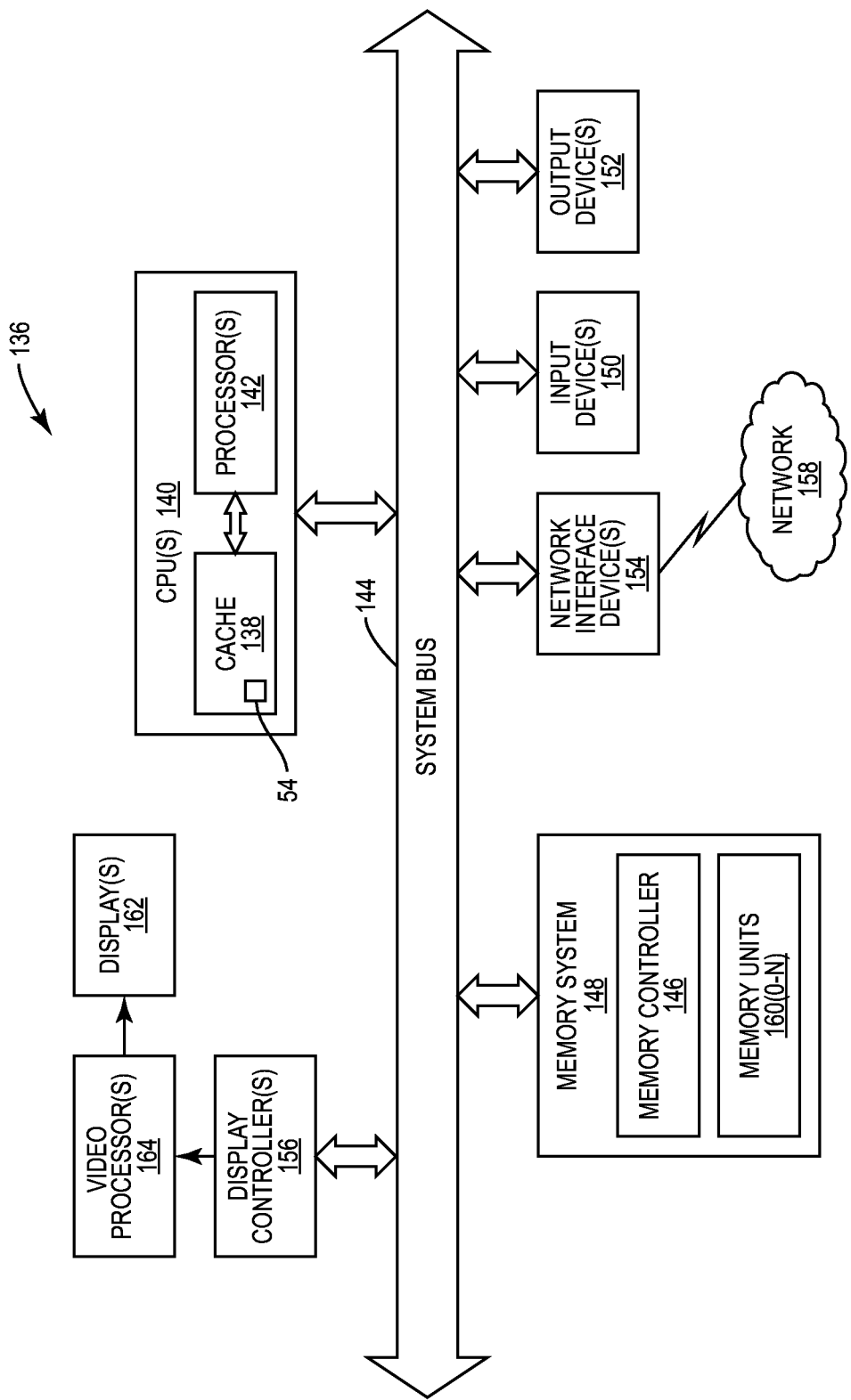
FIG. 9 is a block diagram of an exemplary processor-based system that can include memory employing the decoded $2^n$-bit bitcell in FIG. 3, so as to store decoded words in an area efficient manner while reducing read path latency.

In this regard, FIG. 9 illustrates an example of a processor-based system 136 that can employ decoded $2^n$-bit bitcells 54 in memory, such as cache memory 138, for storing decoded bits illustrated in FIG. 3. In this example, the processor-based system 136 includes one or more central processing units (CPUs) 140, each including one or more processors 142. The CPU(s) 140 may have cache memory 138 coupled to the processor(s) 142 for rapid access to temporarily stored data. The CPU(s) 140 is coupled to a system bus 144 and can intercouple devices included in the processor-based system 136. As is well known, the CPU(s) 140 communicates with these other devices by exchanging address, control, and data information over the system bus 144. For example, the CPU(s) 140 can communicate bus transaction requests to a memory controller 146 as an example of a slave device. Although not illustrated in FIG. 9, multiple system buses 144 could be provided, wherein each system bus 144 constitutes a different fabric.

Other master and slave devices can be connected to the system bus 144. As illustrated in FIG. 9, these devices can include a memory system 148, one or more input devices 150, one or more output devices 152, one or more network interface devices 154, and one or more display controllers 156, as examples. The input device(s) 150 can include any type of input device, including but not limited to input keys, switches, voice processors, etc. The output device(s) 152 can include any type of output device, including but not limited to audio, video, other visual indicators, etc. The network interface device(s) 154 can be any devices configured to allow exchange of data to and from a network 158. The network 158 can be any type of network, including but not limited to a wired or wireless network, a private or public network, a local area network (LAN), a wide local area network (WLAN), and the Internet. The network interface device(s) 154 can be configured to support any type of communication protocol desired. The memory system 148 can include one or more memory units 160(0-N).

The CPU(s) 140 may also be configured to access the display controller(s) 156 over the system bus 144 to control information sent to one or more displays 162. The display controller(s) 156 sends information to the display(s) 162 to be displayed via one or more video processors 164, which process the information to be displayed into a format suitable for the display(s) 162. The display(s) 162 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A decoded $2^n$-bit bitcell in memory for storing decoded bits, comprising:
$2^n$ state nodes each configured to store a decoded bit of a $2^n$-bit decoded word, each state node of the $2^n$ state nodes comprising:
 a storage node configured to:
  store the decoded bit of the $2^n$-bit decoded word; and
  provide the stored decoded bit to a read bitline coupled to a decoded word output in response to a read enable asserted on a read wordline;
 an active decoded bit input coupled to the storage node, the active decoded bit input configured to receive the decoded bit from the $2^n$-bit decoded word of an n-bit encoded word and store the decoded bit in the storage node in response to a write enable asserted on a write wordline;
 $2^n-1$ passive decoded bit inputs each coupled to a storage node within each of the remaining $2^n-1$ state nodes, the $2^n-1$ passive decoded bit inputs configured to receive $2^n-1$ decoded bits of the $2^n$-bit decoded word not received by the active decoded bit input; and
 a logic circuit configured to:
  receive the $2^n-1$ decoded bits over the $2^n-1$ passive decoded bit inputs;
  retain a decoded bit based on the received $2^n-1$ decoded bits; and
  provide the decoded bit to a passive decoded bit output coupled to the storage node to store the decoded bit in the storage node.

2. The decoded $2^n$-bit bitcell of claim 1 configured to receive the decoded bit on the active decoded bit input on each state node of the $2^n$ state nodes when the write enable is asserted on the write wordline.

3. The decoded $2^n$-bit bitcell of claim 1 configured to receive the decoded bit on the active decoded bit input on only one of the $2^n$ state nodes when the write enable is asserted on the write wordline.

4. The decoded $2^n$-bit bitcell of claim 3, wherein the logic circuit of each of the $2^n$ state nodes is further configured to generate the remaining $2^n-1$ decoded bits.

5. The decoded $2^n$-bit bitcell of claim 1, configured to provide the $2^n$ decoded bits provided to the $2^n$ decoded word outputs to a circuit.

6. The decoded $2^n$-bit bitcell of claim 1, wherein the $2^n$-bit decoded word comprises a data array index for addressing memory.

7. The decoded $2^n$-bit bitcell of claim 1, wherein the $2^n$-bit decoded word comprises a way selection that represents a way within a cache memory.

8. The decoded $2^n$-bit bitcell of claim 1, wherein the logic circuit comprises an OR-based logic circuit configured to retain the decoded bit by performing an OR-based function on the $2^n-1$ decoded bits received over the $2^n-1$ passive decoded bit inputs.

9. The decoded $2^n$-bit bitcell of claim 1, wherein the logic circuit comprises an AND-based logic circuit configured to retain the decoded bit by performing an AND-based function on the $2^n-1$ decoded bits received over the $2^n-1$ passive decoded bit inputs.

10. The decoded $2^n$-bit bitcell of claim 1 provided in an integrated circuit (IC).

11. The decoded $2^n$-bit bitcell of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

12. A decoded $2^n$-bit bitcell in memory for storing decoded bits, comprising:
   means for storing each of $2^n$ decoded bits of a $2^n$-bit decoded word in one of $2^n$ state nodes;
   means for receiving a decoded bit from the $2^n$-bit decoded word of an n-bit encoded word on each of the $2^n$ state nodes;
   means for storing, as the decoded bit in each of the $2^n$ state nodes, the decoded bit received on an active decoded bit input on each of the $2^n$ state nodes in response to a write enable asserted on a write wordline;
   means for receiving $2^n-1$ decoded bits on each of the $2^n$ state nodes, the $2^n-1$ decoded bits being the $2^n-1$ decoded bits not received on the active decoded bit input of a given state node of the $2^n$ state nodes;
   means for retaining the decoded bit within each state node of the $2^n$ state nodes by performing a logic function on the received $2^n-1$ decoded bits;
   means for providing the decoded bit of each state node of the $2^n$ state nodes to the remaining $2^n-1$ state nodes; and
   means for providing each of the $2^n$ decoded bits to one of $2^n$ decoded word outputs in response to a read enable asserted on a read wordline.

13. A method for storing a $2^n$-bit decoded word in memory, comprising:
   storing each of $2^n$ decoded bits of a $2^n$-bit decoded word in one of $2^n$ state nodes;
   receiving a decoded bit from the $2^n$-bit decoded word of an n-bit encoded word on an active decoded bit input on each of the $2^n$ state nodes;
   storing, as the decoded bit in each of the $2^n$ state nodes, the decoded bit received on the active decoded bit input in response to a write enable asserted on a write wordline;
   receiving $2^n-1$ decoded bits on each of the $2^n$ state nodes, the $2^n-1$ decoded bits being the $2^n-1$ decoded bits not received on the active decoded bit input on a given state node of the $2^n$ state nodes;
   retaining the decoded bit within each state node of the $2^n$ state nodes by performing a logic function on the received $2^n-1$ decoded bits not received on the active decoded bit input;
   providing the decoded bit of each state node of the $2^n$ state nodes to the remaining $2^n-1$ state nodes; and
   providing each of the $2^n$ decoded bits to one of $2^n$ decoded word outputs in response to a read enable asserted on a read wordline.

14. The method of claim 13, further comprising receiving the decoded bit on the active decoded bit input of each of the $2^n$ state nodes when the write enable is asserted on the write wordline.

15. The method of claim 13, further comprising receiving the decoded bit on the active decoded bit input on only one of the $2^n$ state nodes when the write enable is asserted on the write wordline.

16. The method of claim 15, further comprising generating the decoded bit within each of the remaining $2^n-1$ state nodes that did not receive the decoded bit on the active decoded bit input by performing a logic function on the received $2^n-1$ decoded bits.

17. The method of claim 13, further comprising providing the $2^n$ decoded bits provided to the $2^n$ decoded word outputs to a circuit.

18. The method of claim 13, further comprising using the $2^n$-bit decoded word to represent a data array index for addressing memory.

19. The method of claim 13, further comprising using the $2^n$-bit decoded word to represent a way selection that represents a way within a cache memory.

20. The method of claim 13, further comprising retaining the decoded bit within each of the $2^n$ state nodes by performing an OR-based logic function.

21. The method of claim 13, further comprising retaining the decoded bit within each of the $2^n$ state nodes by performing an AND-based logic function.

22. A cache memory system, comprising:
   a plurality of sets, wherein each set of the plurality of sets is configured to be addressable by a set index, wherein each set comprises:
      a tag array comprising a plurality of decoded $2^n$-bit bitcells, wherein the tag array is configured to:
         store a plurality of $2^n$-bit decoded words within the plurality of decoded $2^n$-bit bitcells, each $2^n$-bit decoded word representing a cache way; and
         provide a $2^n$-bit decoded word representing a selected cache way to a data array;
      each decoded $2^n$-bit bitcell of the plurality of decoded $2^n$-bit bitcells comprising:
         $2^n$ state nodes each configured to store a decoded bit of a $2^n$-bit decoded word of the plurality of $2^n$-bit decoded words, each state node of the $2^n$ state nodes, comprising:
            a storage node configured to:
               store the decoded bit of the $2^n$-bit decoded word; and
               provide the stored decoded bit to a read bitline coupled to a decoded word output in response to a read enable asserted on a read wordline;
            an active decoded bit input coupled to the storage node, the active decoded bit input configured to receive the decoded bit from the $2^n$-bit decoded word of an n-bit encoded word and store the decoded bit in the storage node in response to a write enable asserted on a write wordline;
            $2^n-1$ passive decoded bit inputs each coupled to a storage node within each of the remaining $2^n-1$ state nodes, the $2^n-1$ passive decoded bit inputs configured to receive $2^n-1$ decoded bits of the $2^n$-bit decoded word not received by the active decoded bit input; and
            a logic circuit configured to:
               receive the $2^n-1$ decoded bits over the $2^n-1$ passive decoded bit inputs;
               retain a decoded bit based on the received $2^n-1$ decoded bits; and
               provide the decoded bit to a passive decoded bit output coupled to the storage node to store the decoded bit as the decoded bit in the storage node; and
      the data array configured to:
         store data associated with a plurality of cache ways;
         receive the $2^n$-bit decoded word representing the selected cache way from the tag array; and
         provide the data from the selected cache way to a cache data output.

23. The cache memory system of claim 22, wherein the tag array is further configured to provide the $2^n$-bit decoded word representing the selected cache way to the data array based upon a prediction operation performed by the tag array.

* * * * *